US009276229B2

(12) United States Patent
Verschuren et al.

(10) Patent No.: US 9,276,229 B2
(45) Date of Patent: Mar. 1, 2016

(54) DEVICE AND METHOD FOR LIGHTING

(75) Inventors: Coen Adrianus Verschuren, Eindhoven (NL); Margaretha Maria De Kok, Eindhoven (NL); Herbert Lifka, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 947 days.

(21) Appl. No.: 13/054,668

(22) PCT Filed: Jul. 22, 2009

(86) PCT No.: PCT/IB2009/053184
§ 371 (c)(1),
(2), (4) Date: Jan. 18, 2011

(87) PCT Pub. No.: WO2010/010523
PCT Pub. Date: Jan. 28, 2010

(65) Prior Publication Data
US 2011/0169024 A1    Jul. 14, 2011

(30) Foreign Application Priority Data

Jul. 24, 2008   (EP) .................................... 08161070

(51) Int. Cl.
*H01L 33/50*   (2010.01)
*H01L 51/50*   (2006.01)

(52) U.S. Cl.
CPC .................... *H01L 51/5036* (2013.01)

(58) Field of Classification Search
None
See application file for complete search history.

(56) References Cited

U.S. PATENT DOCUMENTS

| 4,336,545 | A | * | 6/1982 | Howe et al. ................. 346/135.1 |
| 4,731,773 | A | * | 3/1988 | Lewkowicz ................. 369/59.11 |
| 5,656,186 | A | * | 8/1997 | Mourou et al. .......... 219/121.69 |
| 6,399,226 | B1 | | 6/2002 | Kitaguchi et al. |
| 6,407,408 | B1 | * | 6/2002 | Zhou et al. ........................ 257/40 |
| 6,558,219 | B1 | * | 5/2003 | Burroughes et al. ............. 445/24 |
| 7,275,972 | B2 | | 10/2007 | Wolk et al. |
| 7,338,820 | B2 | | 3/2008 | McCormick et al. |
| 2002/0045675 | A1 | * | 4/2002 | Halas et al. ........................ 522/81 |
| 2003/0020124 | A1 | * | 1/2003 | Guenther ....................... 257/400 |
| 2003/0057827 | A1 | * | 3/2003 | Kido et al. ..................... 313/504 |
| 2003/0186078 | A1 | * | 10/2003 | Murata et al. ................. 428/690 |
| 2004/0077250 | A1 | | 4/2004 | Miyadera et al. |
| 2004/0119028 | A1 | * | 6/2004 | McCormick et al. .... 250/492.22 |
| 2005/0040392 | A1 | | 2/2005 | Wu et al. |

(Continued)

FOREIGN PATENT DOCUMENTS

| EP | 0903965 A1 | 3/1999 |
| EP | 1953846 A1 | 8/2008 |

OTHER PUBLICATIONS

Merriam-Webster OnLine definitions of "ablation." No Date.*
Merriam-Webster OnLine definitions of "deformation." No Date.*
American Heritage Dictionary Defintiion of "damage." No Date.*
Merriam-Webster OnLine definition of "loss." No Date.*
Merriam-Webster OnLine definition of "visible." No Date.*

(Continued)

*Primary Examiner* — Hrayr A Sayadian

(57) ABSTRACT

A method is presented for reducing the light output capacity of light emitting components (C1, C2, C3), each with a different absorption band, of an OLED device (1). By irradiating at least a portion of each light emitting component (C1, C2, C3) with light (L) having a wavelength within at least one of the absorption bands, the light output capacity of the irradiated portion (P, P1, P2, P3) of each organic light emitting component having a light absorption band in which the wavelength of the light (L) is included is reduced. An OLED device (1) is also presented.

8 Claims, 6 Drawing Sheets

(56) References Cited

U.S. PATENT DOCUMENTS

| | | |
|---|---|---|
| 2006/0181203 A1 | 8/2006 | Meng et al. |
| 2009/0108741 A1 | 4/2009 | Yokoyama et al. |
| 2011/0169024 A1* | 7/2011 | Verschuren et al. ............ 257/89 |

OTHER PUBLICATIONS

Sagaguchi et al:"Color Control and White Emission of Organic Light-Emitting Device by External Light"; Japanese J. Applied Physics, 2007, vol. 46, pp. L345-L347.

* cited by examiner

DEVICE AND METHOD FOR LIGHTING

FIELD OF THE INVENTION

The technical field of the present inventive concept is lighting. More specifically, the present inventive concept relates to an OLED device and a method where the light output capacity of the OLED device is changed by means of light.

BACKGROUND OF THE INVENTION

Organic light emitting diodes (OLEDs) are in many ways considered as the future in many lighting applications. For instance, patterning of OLEDs is an attractive feature for e.g. ambient lighting. Full 2-dimensional images can be made using a single OLED device, while maintaining intrinsic advantages of OLEDs, such as attractiveness, a diffuse area light source, etc.

It is known to alter light emitting properties of an OLED device during the fabrication of an OLED device, using photolithography.

US 2003/0186078 discloses RGB-patterning of OLED devices for the fabrication of an electroluminescent display. Individual color pixels are formed by doping a common blue-emitting host with two or more photo-bleachable dopants, such as red and green organic materials. Light at wavelengths proximate to the maximum absorption peaks of the guest materials to be photo-bleached is radiated onto the surface of the material in the presence of oxygen. The combination of light and oxygen bleaches the desired emitting species and renders it non-emissive, thus changing the color of the mixture of emitting species.

However, a drawback with this solution is that it is complicated in that there need to be specific conditions for the patterning.

SUMMARY OF THE INVENTION

A general object is to provide a method of reducing the light output capacity in an OLED device. This and further objects will be described further below.

According to a first aspect of the inventive concept a method is provided for reducing the light output capacity of at least one of a plurality of organic light emitting components in an organic light emitting diode (OLED) device, each of the plurality of organic light emitting components having a different light absorption band, the method comprising:

irradiating at least a portion of each of the plurality of organic light emitting components with light having a wavelength within the light absorption band of at least one of the plurality of organic light emitting components and an intensity below a deformation threshold of each of the plurality of organic light emitting components, wherein the light output capacity of the irradiated portion of each organic light emitting component having a light absorption band in which the wavelength of said light is included is reduced.

Light output capacity should be construed as the amount of light that can be emitted from the organic light emitting component(s) in question. The present method uses external irradiation to locally and selectively tune the light output of different organic light emitting components or layers in the OLED device. Beneficially, the present method may be used to produce a multi-color image or pattern, i.e. patterning with different colors. Alternatively, the present method may advantageously be used to alter the color of the light output of the OLED device, either partly or completely, e.g. to tune the color point. Hence, an effect which may be obtained thereby is color tuneability of the OLED device. In particular, subtractive color tuning may be achieved, selectively removing colors e.g. from the red end of the visible spectrum towards the blue end. Moreover, visible damage of the organic light emitting device may be avoided due to the light intensity being below a deformation threshold. The deformation threshold is defined as the highest light intensity which can irradiate a cathode, an anode and the organic light emitting component(s) of the OLED device without causing physically, mechanically and/or thermally induced modifications in the cathode and anode, and without leaving visible marks on the organic light emitting component(s).

The light output capacity of the irradiated portion of any organic light emitting component having a light absorption band in which the wavelength of said light is not included may be preserved. Irradiating (laser) light with wavelengths within the absorption band of an organic light emitting component may be wholly or partially absorbed, altering the molecular structure, and thereby reducing the light emitting capacity of the organic light emitting component. Organic light emitting components with absorption bands not comprising the wavelength of the irradiating (laser) light will not absorb the irradiating light, resulting in an unaltered light emitting capacity of these organic light emitting components.

The light may be laser light. Thereby, high resolution images may effectively be produced on the OLED device due to the inherent properties of laser light. Moreover, laser diodes may be modulated at high frequencies, enabling versatile patterning with high resolution.

Alternatively, flood sources of light may be applied in combination with for instance shadow masks.

The intensity of the light may be below a cathode and anode deformation threshold of the OLED device. Thereby, thermal damage to the cathode and anode or any of the other materials may be prevented, enabling the OLED device to function properly.

An embodiment may comprise encapsulating the OLED device. The OLED device may e.g. be encapsulated with an encapsulating lid. Also other encapsulation methods can be used e.g. Thin Film Encapsulation, or full area gluing of a water barrier. Encapsulation may be performed prior to irradiation. An advantage obtainable thereby is that patterning of images may be performed on customer demand, off-site from a factory, on pre-produced, encapsulated OLED devices. In an encapsulated OLED device, the sensitive internal components of the OLED device may be protected from contamination and degradation.

Alternatively, encapsulation may be performed after irradiation. Thus, a flexible way of providing an OLED device with a reduced light output capacity may be achieved, e.g. the irradiation process is not dependent on whether the OLED device is encapsulated or not. For some requirements, it may be beneficial to irradiate the OLED device before it is encapsulated.

Alternatively, the OLED device may also be irradiated before cathode deposition. For some requirements, it may be beneficial to irradiate the OLED device prior to the cathode deposition.

According to a second aspect of the inventive concept, there is provided an organic light emitting diode (OLED) device comprising:

a plurality of organic light emitting components, each of the plurality of organic light emitting components having a different light absorption band, wherein the light output capacity of at least one of the plurality of organic light emitting components is reduced, using the method according to the first aspect of the inventive concept.

That is to say, in the present OLED device, at least a portion of each of the plurality of organic light emitting components is irradiated with light having a wavelength within the light absorption band of at least one of the plurality of organic light emitting components and an intensity below a deformation threshold of each of the plurality of organic light emitting components, wherein the light output capacity of the irradiated portion of each organic light emitting component having a light absorption band in which the wavelength of said light is included is reduced.

Generally, this second aspect may exhibit the same advantages and features as the first aspect.

The plurality of organic light emitting components may be arranged in a multilayered emissive layer, for instance one organic light emitting component per layer. The layers are preferably stacked.

Alternatively, the plurality of organic light emitting components may be arranged in a single-layered emissive layer. Polymers may be mixed prior to deposition, enabling a single layer to be processed, which may be beneficiary from a manufacturing standpoint.

Further, an OLED device with a layer with more than one organic light emitting component and a layer with only one organic light emitting component is envisaged.

Additional possible features and preferred embodiments are set out in the dependent claims and disclosed in the following. It is noted that the invention relates to all possible combinations of features recited in the claims.

BRIEF DESCRIPTION OF THE DRAWINGS

The inventive concept and further advantages will now be described by way of non-limiting embodiments, with reference to the accompanying drawings.

FIGS. 4a-b shows a schematic view of an example of irradiation of the multilayered emissive layer in FIG. 3a.

DETAILED DESCRIPTION

Figure 1:
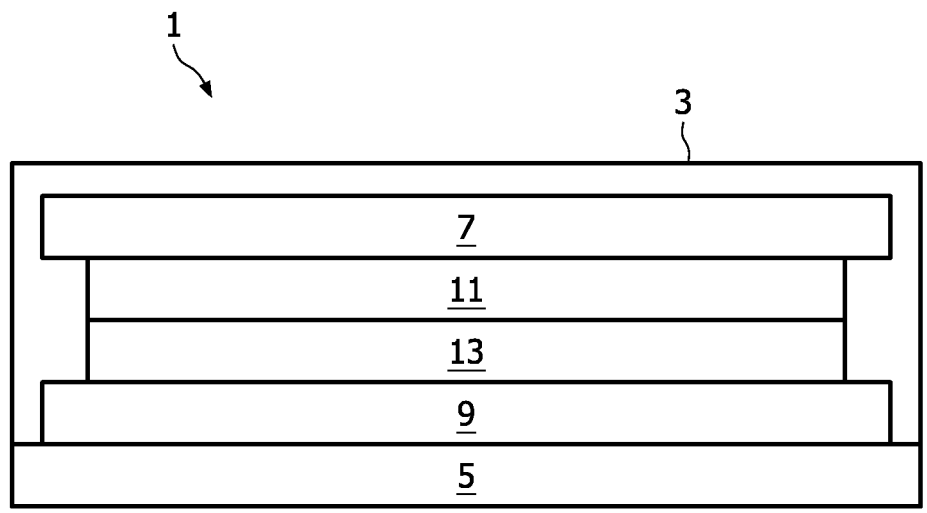
FIG. 1 shows a cross-sectional side view of an embodiment of an OLED device according to the inventive concept.

FIG. 1 shows a cross-sectional view of an embodiment of an OLED device 1 according to the inventive concept. The OLED device 1 comprises an encapsulating body 3, made of e.g. glass, metal or other hermetic coatings for the protection of internal components 7,9,11,13 from contamination, e.g. moisture or dirt. The encapsulating body 3 might also contain getters to absorb water which might have penetrated the encapsulation. Inside the encapsulating body 3, the OLED device comprises a cathode 7, an anode 9 and a light emitting layer comprising an emissive layer 11 and an electrically conductive layer 13. These internal components may be placed on a substrate 5 made of e.g. glass, by e.g. placing the anode 9, the conductive layer 13, the emissive layer 11, and the cathode 7 on the substrate 5 in the mentioned order. The emissive and conductive layers 11 and 13, respectively, may be produced from an organic material such as a polymer or oligomer. The emissive layer 11 can comprise different organic light emitting components C1 and C2 (shown in e.g. FIGS. 3a-b) with specific absorption band properties, which are different from each other. The organic light emitting components may have different light emitting spectra.

The organic light emitting components may be copolymerized and combined into a single emissive layer 11-2. Alternatively, different small molecule oligomers may be combined into stacked layers forming an emissive layer 11-1. Stacked layers may also be combined with copolymerized single layers so as to form an emissive layer 11-3.

When a positive voltage is applied to the anode 9 and the cathode 7, a current will flow through the emissive layer 11 and the conductive layer 13, eventually resulting in electron-hole recombination and emission of light from the OLED device. For the emission of light through e.g. the anode 9, the anode 9 may comprise Indium tin-oxide (ITO), fluoridated zinc-oxide or another transparent conductor. Alternatively, the cathode 7 may also be transparent.

The function of conductive layer 13 and anode 9 can, in an embodiment, be combined into a single layer.

When the OLED device 1 is irradiated by laser light L (shown in FIG. 2) from an external light source (not shown), such as a laser, the light output capacity of an irradiated portion P of organic light emitting components, having an absorption band comprising the wavelength of the irradiating laser light L, may be reduced. The light L can be transmitted through the cathode 7 if the latter is transparent, but also through the anode 9. Organic light emitting components having an absorption band outside the wavelength of the irradiating light may preserve their respective light output capacity. For instance, if an organic light emitting component C1 has a blue light emitting spectrum, e.g. emission around 460 nm and absorption at even shorter wavelengths, irradiating laser light with a wavelength of 532 nm may not reduce the light output capacity of the organic light emitting component C1.

A plurality of organic light emitting components in the emissive layer 11 with different light emission spectra may then provide an OLED device 1 with a light output being a mixture of the emissive wavelengths of the plurality of organic light emitting components.

Hence, for the OLED device 1, comprising a plurality of different organic light emitting components in its emissive layer 11, it may be possible to tune the light output capacity in a subtractive way. For instance, if each of the plurality of organic light emitting components in the OLED device 1 has a distinct light emission spectrum and absorption band spread throughout the visible light spectrum, each organic light emitting component may be irradiated by light of a wavelength within its absorption band, thereby obtaining a reduced light output capacity. A wavelength of the irradiating laser light L inside an absorption band of the organic light emitting component with the longest emissive wavelength may then reduce the light output properties of this organic light emitting component. A wavelength of the irradiating laser light L inside the absorption band of the organic light emitting component with the second longest wavelength (but outside an absorption band of an organic light emitting component with a third longest emissive wavelength) may then reduce the light output capacity of the component with the longest emissive wavelength, the second longest wavelength and so on. Hence, a wavelength of the irradiating laser light L2 inside the absorption band of the organic light emitting component with the shortest emissive wavelength may reduce the light output capacity of all organic light emitting components of the OLED device 1. In this way a subtractive tunable OLED device 1, comprising organic light emitting components in the range from the longest wavelength organic light emitting component to the shortest wavelength organic light emitting component, may be provided with the possibility of image patterning with multiple colors. An intensity of the irradiating light, preferably laser light, may be below a deformation threshold of the organic light emitting components C1 and C2. Moreover, the intensity of the irradiating light may be tuned to achieve varying degrees of reduction of the light emitting capacity of the organic light emitting components C1 and C2. Thereby, a continuously tunable spectrum between e.g. the emission spectra of the two organic light emitting components C1 and C2 may be obtainable.

In another way of exposure of the OLED device, an intensity of the irradiating light L can be set to a level which completely inhibits light emission of a color in the OLED device 1 if an organic light emitting component's absorption band comprises the wavelength of the irradiating light L, but which leaves emissions of shorter wavelengths intact, i.e. of organic light emitting components having a shorter wavelength than the irradiating light L and having absorption bands not comprising the wavelength of the irradiating light L. Then, in a similar way to laser printers, e.g. using techniques like random dithering, 'grey' values can be made per color by having more or fewer 'pixels' exposed. Pixels in this context should be construed as a set of molecules in an organic light emitting component constituting a smallest visible resolution when patterned.

Figure 2:
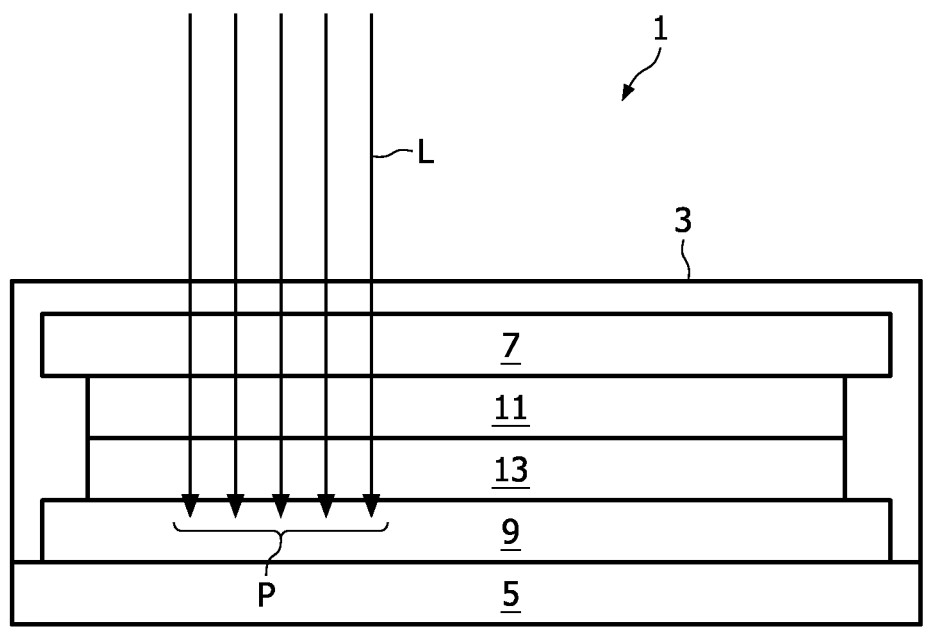
FIG. 2 shows a schematic view of irradiation of the OLED device in FIG. 1.

FIG. 2 shows in a schematic view the irradiation of the OLED device in FIG. 1. In the example shown in FIG. 2, laser light L irradiates the portion P in a horizontal plane of each layer (the encapsulating body 3, the cathode 7, the emissive layer 11, the conductive layer 13, the anode 9 and the substrate 5) as the laser light L passes through the OLED device 1 in a vertical direction. The laser light L may affect organic light emitting components C1 or C2, depending on the wavelength of the laser light L and the absorption bands of C1 and C2, as described above. If the laser light L has a wavelength within the absorption band of an organic light emitting component, its molecular structure will change and reduce the light output capacity of the irradiated portion P of the organic light emitting component. Preferably, an intensity of the laser light is below a deformation threshold of the cathode 7, the anode, 9, the emissive layer 11, the conductive layer 13, and hence also of the organic light emitting components C1 and C2. This may be beneficial for precluding any visible signs on the OLED device 1 when in the OFF-state.

Figure 3A:
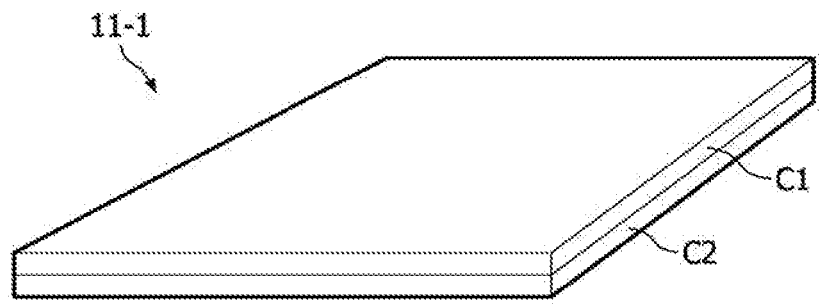
FIG. 3a shows a schematic perspective view of a multilayered emissive layer according to the inventive concept.

FIG. 3*a* shows a schematic view of a multilayered emissive layer 11-1 according to the inventive concept. The absorption bands of C1 and C2 can be different, and the light emitting spectra can be different as well. In an embodiment, a plurality of different layered organic light emitting components may be used, i.e. more than two different organic light emitting components. The organic light emitting components may be a stack of oligomers.

Figure 3B:
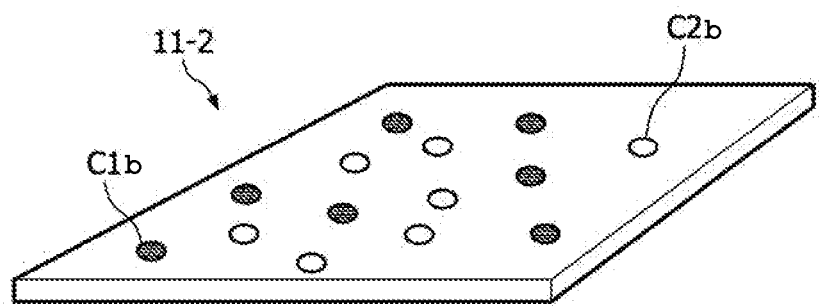
FIG. 3b shows a schematic view of a single-layered emissive layer according to the inventive concept.

FIG. 3*b* shows a schematic view of a single-layered emissive component 11-2 according to the inventive concept. In this example, two organic light emitting components C1*b* and C2*b* are present, however, additional organic light emitting components may be possible within the scope of the inventive concept. The single layer of organic light emitting components C1*b* and C2*b* can have absorption bands that are different with respect to each other as well as different emission spectra. The organic light emitting components C1*b* and C2*b* may be dyes in a single copolymerized combination of monomers.

Figure 3C:
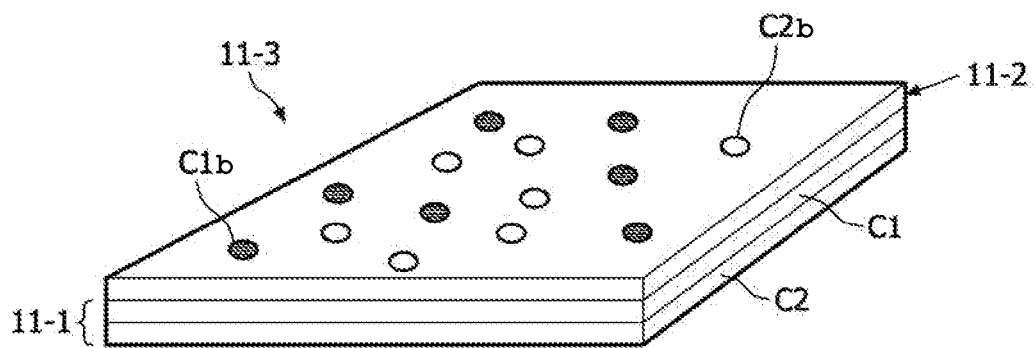
FIG. 3c shows a schematic view of a combined single-layer multilayer-emissive layer according to the inventive concept.

FIG. 3*c* shows a schematic view of a combined single-layer multilayer emissive layer 11-3 according to the inventive concept. In this example, a single-layer emissive layer 11-2 comprising the organic light emitting components C1*b* and C2*b* is present as well as a multilayered emissive layer 11-1, together forming the combined single-layer multilayer emissive layer 11-3. The multilayer emissive layer 11-2 may comprise other types of organic light emitting components than C1 and C2 for enhanced possibilities of light output effects after irradiation with laser light of e.g. different wavelength for different portions of the combined single-layer multilayer emissive layer 11-3.

Figure 4A:
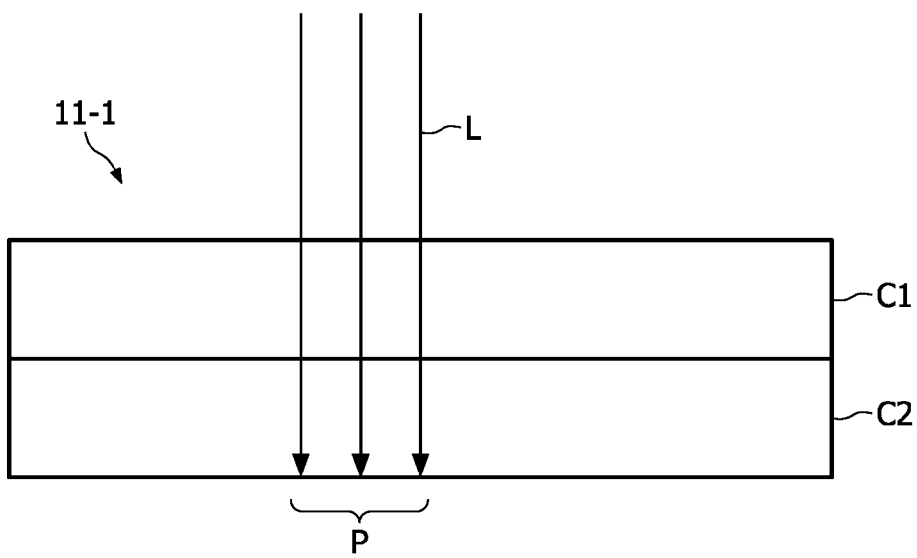
Figure 4B:
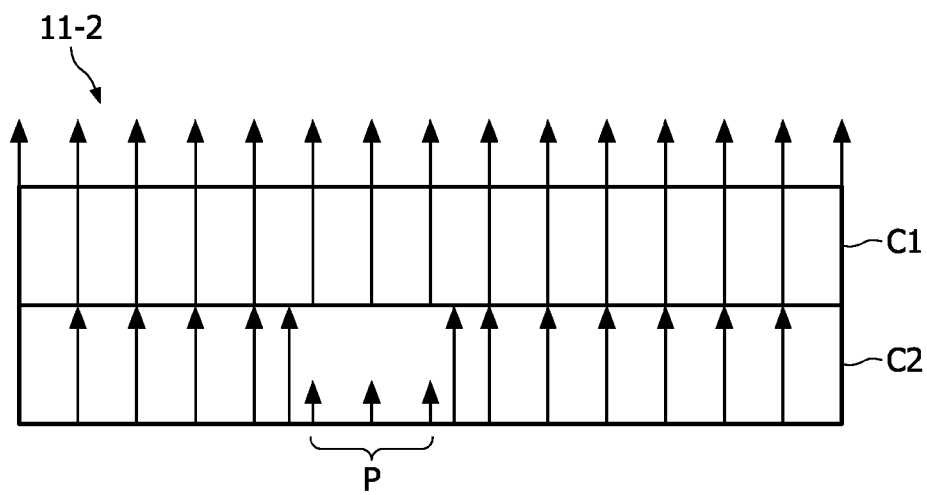

FIGS. 4*a*-*b* show a schematic view of an example of irradiation of the multilayer light emitting layer 11-1 in FIG. 3*a*. For the sake of clarity, only the multilayer light emitting layer 11-1 is shown (the anode 9, the cathode 7, the substrate 5, etc are left out).

Laser light L irradiates the portion P of the organic light emitting components C1 and C2. The laser light L has an intensity below a predefined threshold of deformation of the organic light emitting components C1 and C2, the anode 9 and the cathode 7 of the OLED device 1. Light intensities above the predefined threshold may result in thermal damage to any of the mentioned components. The irradiation operation can be carried out on the encapsulated OLED device 1. Alternatively, the organic light emitting components C1 and C2 may be irradiated prior to encapsulation.

In this example, C1 can e.g. be a blue emitting polymer layer (light emission around 460 nm) and C2 a yellow emitting polymer (light emission e.g. 530-540 nm). The laser light L can have a wavelength within the absorption band of C2, e.g. 532 nm, provided by e.g. a frequency doubled Nd:YAG laser. The irradiating may result in a reduced light output capacity of the organic light emitting component C2 due to molecular changes in the organic light emitting component C2, in response to said irradiating with the laser light L, as shown in FIG. 4*b* (upward pointing arrows indicating the amount of emitted light). The organic light emitting component C1 may have preserved the same light output capacity within its emissive spectrum, e.g. 460 nm, as before the irradiating with laser light L. The organic light emitting component C2 produced from the yellow emitting polymer will have a reduced light output capacity in the irradiated portion P and will have preserved its light emitting capacity in portions not having been subject to irradiation by the laser light L.

Hence, in this case, the resulting overall output of the OLED device 1 is changed such that a blue pattern is visible at the portion P, while the rest of the device emits green light. This example illustrates subtractive tuning of the OLED device 1.

In contrast, if the irradiating laser light L has a wavelength within absorption bands of the organic light emitting component C1, then this irradiation may result in a reduced light output capacity in both the organic light emitting component C1 and the organic light emitting component C2.

Figure 5A:
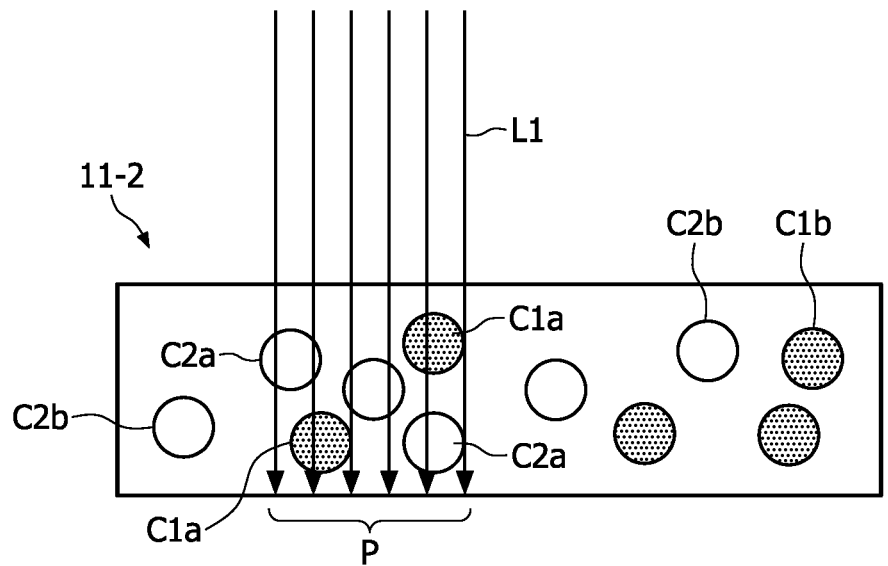
FIGS. 5a-b shows a schematic view of an example of irradiation of the single-layered emissive layer in FIG. 3b.
Figure 5B:
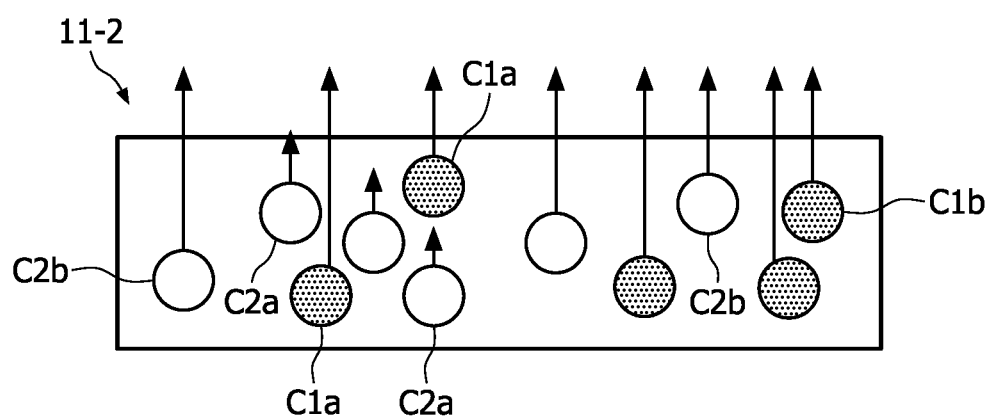

FIGS. 5a-b show an example of irradiation of the single layer emissive layer 11-2 in FIG. 3b. For the sake of clarity, only the single-layer light emitting layer 11-2 is shown (the anode 9, the cathode 7, the substrate 5, etc are left out).

Laser light L irradiates the organic light emitting components C1a and C2a at a portion P, which components are comprised within the single-layer emissive layer 11-2. The laser light L has an intensity below a predefined threshold of deformation of the organic light emitting components C1a-b and C2a-b, the anode 9 and the cathode 7 of the OLED device 1. The irradiation operation can be carried out on the encapsulated OLED device 1. Alternatively, the organic light emitting components C1 and C2 may be irradiated prior to encapsulation.

In this example, C1 can e.g. be a blue emitting polymer or oligomer (light emission around 460 nm) and C2 a yellow emitting polymer or oligomer (light emission e.g. 530-540 nm). The laser light L can have a wavelength within the absorption band of C2, e.g. 532 nm, provided by e.g. a frequency doubled Nd:YAG laser. The irradiating may result in a reduced light output capacity of the organic light emitting components C2a, as illustrated by the irradiated organic light emitting components C2a, due to molecular changes in response to said irradiating with the laser light L. The irradiated organic light emitting component C1a may have preserved the same light output capacity within its emissive spectrum, e.g. 460 nm, as before the irradiating with laser light L. However, the organic light emitting component C2a produced from the yellow emitting polymer or oligomer will have a reduced light output capacity in the irradiated portion P and preserve its light emission in portions not having been subject to the laser light L. Organic light emitting components C1b and C2b, which have not been irradiated, may have preserved their light output capacity.

Figure 6:
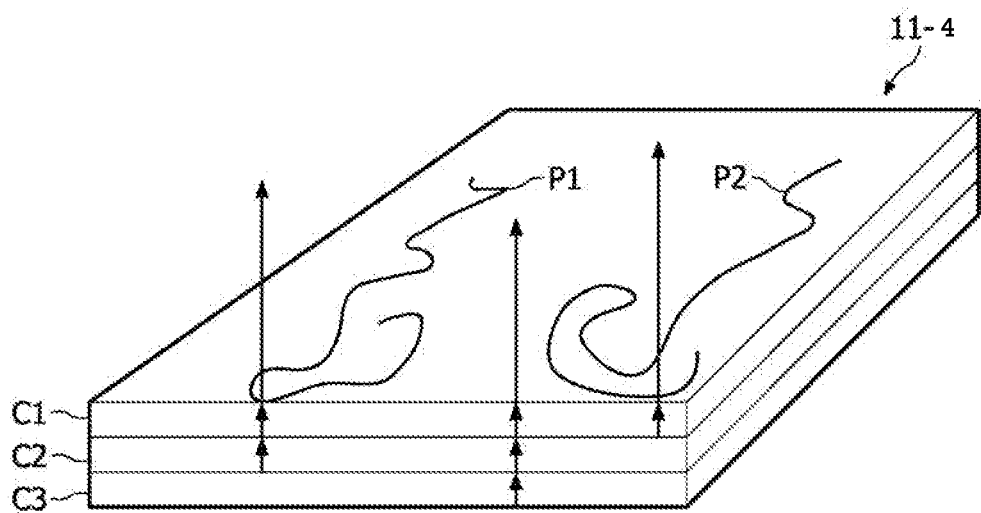
FIG. 6 shows a schematic view of an example of a multilayered emissive layer according to the inventive concept.

FIG. 6 shows a schematic view of an example of a multilayered emissive layer 11-4 according to the inventive concept. For the sake of clarity, only the multilayer light emitting layer 11-4 is shown (the anode 9, the cathode 7, the substrate 5, etc are left out).

The OLED device 1 may comprise multiple layers of organic light emitting components C1, C2 and C3, where each organic light emitting component C1, C2 and C3 can have different absorption bands and different emission spectra. The example illustrated in FIG. 6 shows organic light emitting components C1, C2, and C3 having previously irradiated portions P1 and P2.

In this example, C1 can e.g. be a blue emitting polymer, C2 a yellow emitting polymer, and C3 a red emitting polymer. The portion P1 may previously have been irradiated by a laser with a red wavelength, such as 632.8 nm, provided by e.g. a HeNe laser, within an absorption band of the organic light emitting component C3. The irradiating may reduce the light output capacity of the organic light emitting component C3 in the irradiated portion P1. However, as absorption bands of the organic light emitting components C1 and C2 do not comprise the red wavelength used for irradiation, the components C1 and C2 may preserve their light output capacity in the irradiated portion P1. The combination of the blue, yellow and red organic light emitting components C1, C2 and C3, respectively, may give a white light emitting appearance to the OLED device 1, wherein the irradiated portion P1 will emit green light.

The portion P2 may have previously been irradiated with light of a wavelength which is comprised within the absorption bands of the organic light emitting components C2 and C3. Such a wavelength may e.g. be 532 nm provided by e.g. a Nd:YAG laser. The irradiating may reduce the light output capacity of the organic light emitting components C2 and C3 in the irradiated portion P2. However, since the absorption band of the organic light emitting components C1 does not comprise the wavelength used for irradiation, the organic light emitting component C1 may preserve its light output capacity in the irradiated portion P2.

Moreover, where no laser irradiation has occurred, all three organic light emitting components C1, C2 and C3 may have preserved their light emitting capacity.

Figure 7:
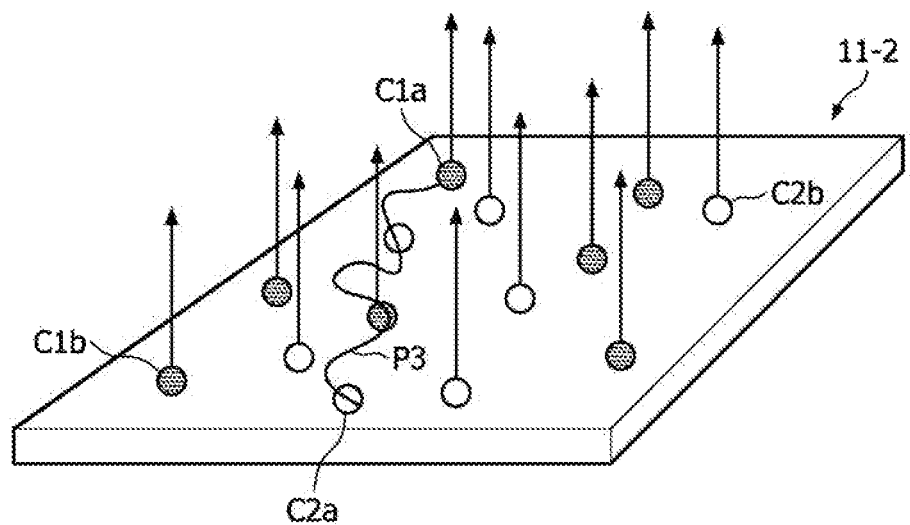
FIG. 7 shows a schematic view of an example of a single-layered emissive layer according to the inventive concept.

FIG. 7 shows a schematic view of an example of a single-layer emissive layer 11-2 according to the inventive concept. For the sake of clarity, only the single-layer light emitting layer 11-2 is shown (the anode 9, the cathode 7, the substrate 5, etc are left out).

The single-layer emissive layer 11-2 of the OLED device 1 comprises organic light emitting components C1a-b and C2a-b having different absorption bands with respect to each other, and different emission spectra. Portion P3 has previously been irradiated by laser light L. In this example, in the portion P3, the organic light emitting components C1a-b have preserved their light output capacity, because the laser light L has a wavelength outside an absorption band of the organic light emitting components C1a. The light output capacity of the organic light emitting components C2a has been reduced due to the laser light L. The overall light output capacity of the OLED device 1 has thereby been reduced, or altered.

This may be advantageous for color-patterning the OLED device 1 before or after encapsulation. For example, if the organic light emitting components C1a-b have blue emission spectra, and the organic light emitting components C2a-b have yellow emission spectra, their combination will result in a green emission OLED device 1. However, the portion P3 irradiated with laser light L may have a reduced light output capacity in the organic light emitting components C2a, resulting in blue emission from the organic light emitting components C1a in this portion. Portions that have not been irradiated may have preserved their light output capacity, resulting in a green emission OLED device 1 with a blue emission portion P3.

Thus, depending on the number of different organic light emitting components with a different light output capacity, and on the wavelength of the irradiating laser light, it may be possible to tune the light output capacity, i.e. the color of the OLED device 1 and thereby provide full color images on an OLED device 1. In this context, tuning the light output capacity means that the emission colors of the OLED device may be altered if the OLED device is irradiated with laser light as described above.

Depending on the intensity of the irradiating laser light L, it may also be possible to tune the luminance of the emissive layer 11. The higher the intensity, the more reduced is the luminance of organic light emitting components having absorption bands comprising the wavelength of the irradiating laser light.

Figure 8:
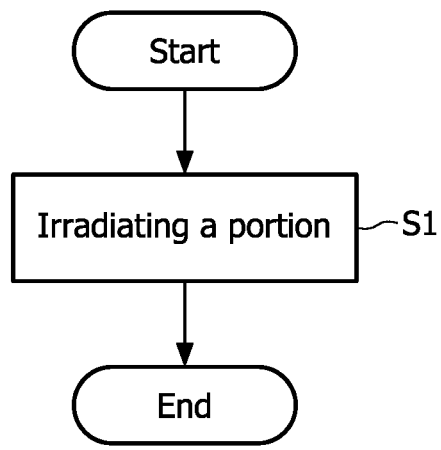
FIG. 8 shows a flow chart illustrating the altering of the light emitting capacity of an OLED device according to an embodiment of the inventive concept.

FIG. 8 shows a flow chart illustrating the altering of the light emitting capacity of an OLED device according to an embodiment of the inventive concept.

In a step S1, a portion of each of a plurality of organic light emitting components are irradiated by light. The light may have a wavelength within an absorption band of at least one of the plurality of organic light emitting components, and an intensity below a predefined deformation threshold of each of the plurality of organic light emitting components. The plurality of organic light emitting components may be comprised within an emissive layer 11 of the OLED device 1.

In response to step S1, the light output capacity of the irradiated portion of each organic light emitting component, having a light absorption band in which the wavelength of the light is included, is reduced.

Figure 9:
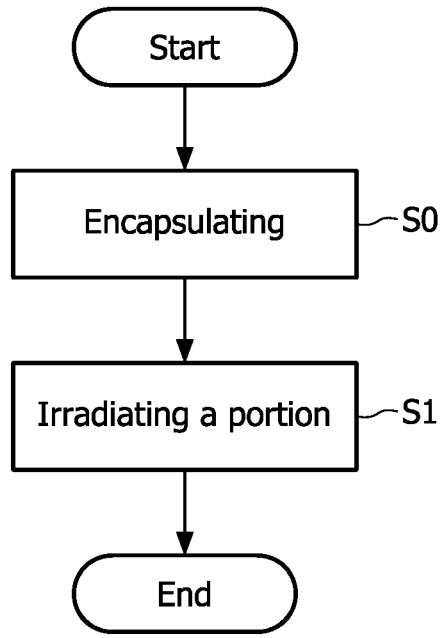
FIG. 9 shows a flow chart illustrating the altering of the light emitting capacity of an OLED device according to an embodiment of the inventive concept.

FIG. 9 shows a flow chart illustrating the altering of the light emitting capacity of an OLED device according to an embodiment of the inventive concept.

In a step S0, the OLED device is encapsulated in an encapsulating body, such as an encapsulating lid. The encapsulating body may protect the OLED device from moisture and/or contamination.

In step S1, a portion of each of a plurality of organic light emitting components are irradiated by light. The light may have a wavelength within an absorption band of at least one of the plurality of organic light emitting components, and an intensity below a predefined deformation threshold of each of the plurality of organic light emitting components. The plurality of organic light emitting components may be comprised within an emissive layer 11 of the OLED device 1.

It may be advantageous from a business perspective to irradiate the plurality of organic light emitting components after encapsulation, as patterning of images may be performed on customer demand, off-site from a factory, on pre-produced OLED devices.

In an alternative embodiment, the step S0 of encapsulating the OLED device may, however, be performed after step S1.

The person skilled in the art realizes that the present invention is by no means limited to the preferred embodiments described above. On the contrary, many modifications and variations are possible within the scope of the appended claims.

Applications of the present method and device include, but are not limited to, decorative lighting, signage and the manufacturing of pixels in OLED displays, which may be produced by red, green, blue emitting areas of the OLED device 1. Costly patterning methods currently used may thereby be replaced by a single evaporation or spincoating step followed by laser irradiation.

The invention claimed is:

1. A method of reducing the light output capacity of at least one of a plurality of organic light emitting components in an organic light emitting diode (OLED) device, each of the plurality of organic light emitting components having a different light absorption band, the method comprising:
    irradiating a portion of the plurality of organic light emitting components with light to provide an irradiated portion, the light having a wavelength within the light absorption band of at least one of the plurality of organic light emitting components and an intensity below a deformation threshold of each of the plurality of organic light emitting components,
        wherein the deformation threshold is the highest intensity of light that does not leave visible marks on the plurality of organic light emitting components when the plurality of organic light emitting components, a cathode and an anode of the OLED device are irradiated with said light having said highest intensity,
        wherein in the irradiated portion, the light output capacity of each of the plurality of organic light emitting components having a light absorption band in which the wavelength of said light is included is reduced, and
    wherein in the irradiated portion, the light output capacity of any of the plurality of the organic light emitting components having a light absorption band in which the wavelength of said light is not included is preserved.

2. The method as claimed in claim 1, wherein the light is laser light.

3. The method as claimed in claim 1, wherein
    the intensity of the light is below a cathode and anode deformation threshold of the OLED device.

4. The method as claimed in claim 1, further comprising encapsulating the OLED device.

5. An organic light emitting diode (OLED) device comprising:
    a plurality of organic light emitting components, each of the plurality of organic light emitting components having a different light absorption band,
    wherein the light output capacity of at least one of the plurality of organic light emitting components is reduced using the method according to claim 1.

6. The OLED device as claimed in claim 5, wherein the plurality of organic light emitting components are arranged in a multilayered emissive layer.

7. The OLED device as claimed in claim 5, wherein the plurality of organic light emitting components are arranged in a single-layered emissive layer.

8. The method of claim 1, wherein the irradiating comprises irradiating a plurality of stacked layers, wherein each of the layers is primarily comprised of a different one of said organic light emitting components.

* * * * *